US009484929B2

(12) United States Patent
Werker

(10) Patent No.: US 9,484,929 B2
(45) Date of Patent: Nov. 1, 2016

(54) CIRCUIT ARRANGEMENT AND METHOD FOR CALIBRATING ACTIVATION SIGNALS FOR VOLTAGE-CONTROLLED OSCILLATORS

(71) Applicant: SILICON LINE GMBH, Munich (DE)

(72) Inventor: Heinz Werker, Huglfing (DE)

(73) Assignee: Silicon Line GmbH, Munich (DE)

( * ) Notice: Subject to any disclaimer, the term of this patent is extended or adjusted under 35 U.S.C. 154(b) by 0 days.

(21) Appl. No.: 14/552,173

(22) Filed: Nov. 24, 2014

(65) Prior Publication Data
US 2015/0381185 A1 Dec. 31, 2015

Related U.S. Application Data

(63) Continuation of application No. PCT/DE2013/200016, filed on May 23, 2013.

(30) Foreign Application Priority Data

May 23, 2012 (DE) .................. 10 2012 104 472

(51) Int. Cl.
*H03B 5/12* (2006.01)
*H03L 7/00* (2006.01)
(Continued)

(52) U.S. Cl.
CPC . *H03L 7/00* (2013.01); *H03B 1/00* (2013.01); *H03L 7/0805* (2013.01); *H03L 7/085* (2013.01); *H03L 7/099* (2013.01); *H03L 7/18* (2013.01); *H04L 7/033* (2013.01)

(58) Field of Classification Search
CPC ............ H03B 1/00; H03L 7/18; H04L 7/033

USPC ......... 331/177 V, 1 A, 34, 16; 327/156, 159; 375/376, 373, 326, 344
See application file for complete search history.

(56) References Cited

U.S. PATENT DOCUMENTS 5,726,607 A * 3/1998 Brede ................... H03L 7/07
331/14
6,259,326 B1 7/2001 Dunlop et al.
(Continued)

FOREIGN PATENT DOCUMENTS

EP 0739089 A2 10/1996

OTHER PUBLICATIONS

International Search Report; PCT/DE2013/200016; Dec. 13, 2013.

*Primary Examiner* — Arnold Kinkead
(74) *Attorney, Agent, or Firm* — Studebaker & Brackett PC

(57) ABSTRACT

In order to develop a circuit arrangement and also a method for calibrating at least one activation signal provided for a voltage-controlled oscillator such that the expenditure of energy is as low as possible and the output frequency is as high as possible, it is proposed—that the respective number of clock cycles for at least one calibration oscillator and at least one reference oscillator associated with the calibration oscillator is counted by means of at least one clock cycle counter connected downstream of the calibration oscillator and the reference oscillator and a clock error resulting from the difference between these two numbers of clock cycles is integrated and—that the clock error is converted by means of at least one digital-to-analog converter connected downstream of the clock counter into analog tuning signals from which the calibrated activation signal is derived.

20 Claims, 7 Drawing Sheets

(51) Int. Cl.
*H04L 7/033* (2006.01)
*H03L 7/18* (2006.01)
*H03B 1/00* (2006.01)
*H03L 7/08* (2006.01)
*H03L 7/085* (2006.01)
*H03L 7/099* (2006.01)

(56) References Cited

U.S. PATENT DOCUMENTS 7,129,763 B1 10/2006 Bennett et al.
8,125,285 B2 * 2/2012 Titus .................. H03L 7/099
327/156

* cited by examiner

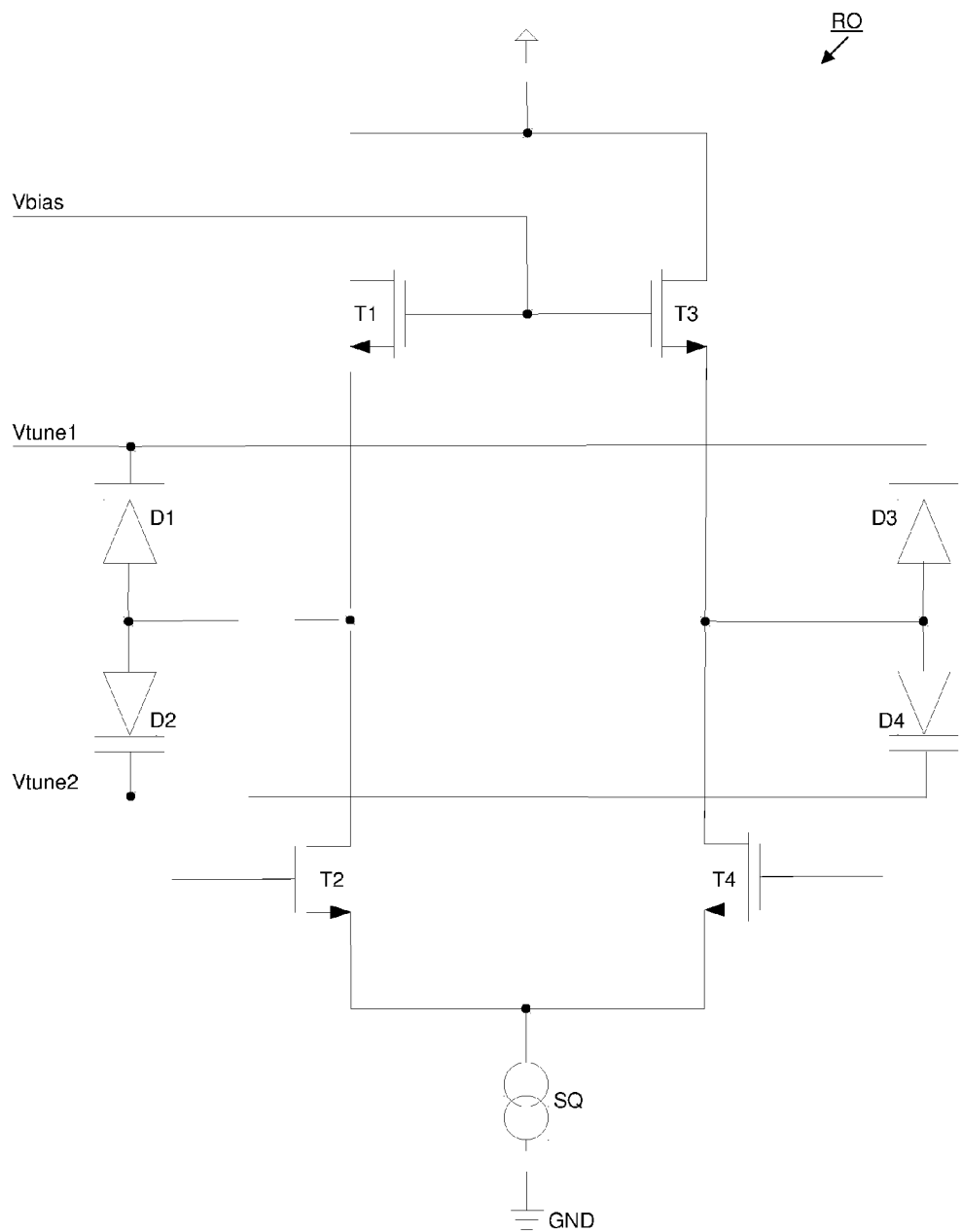
Fig. 1 (= prior art)

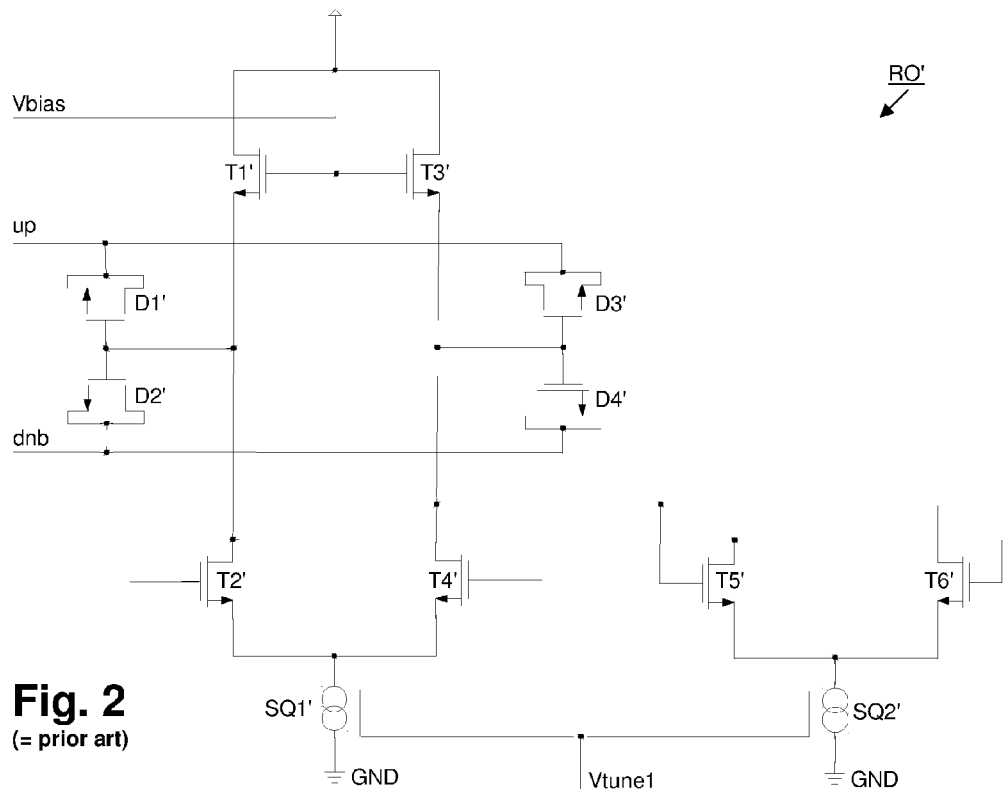
Fig. 2 (= prior art)
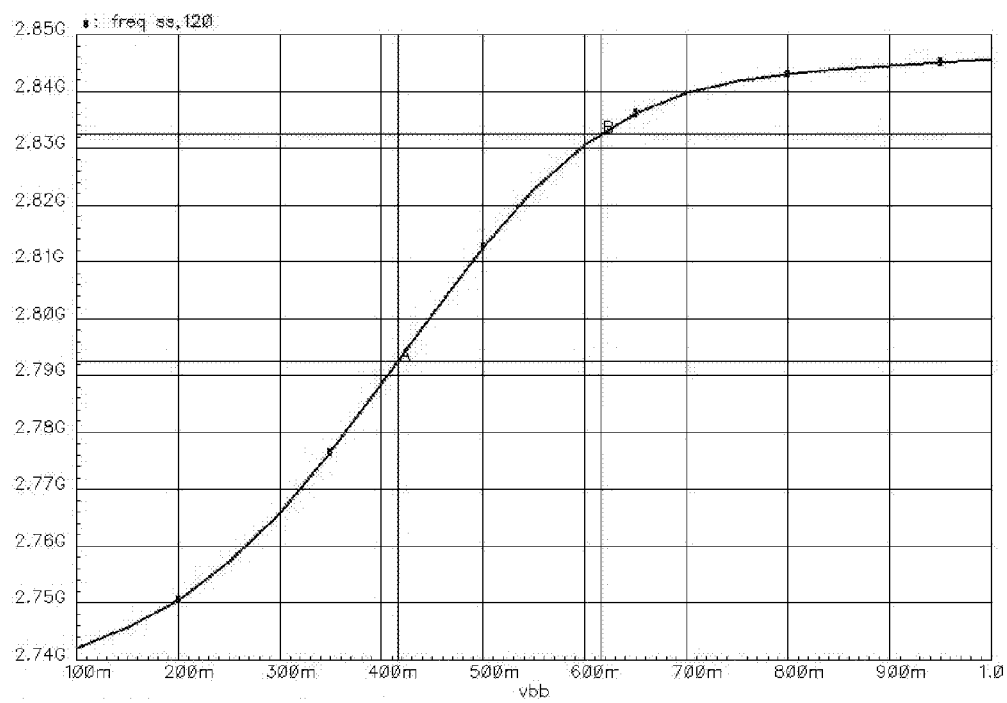
Fig. 3 (= prior art)

CIRCUIT ARRANGEMENT AND METHOD FOR CALIBRATING ACTIVATION SIGNALS FOR VOLTAGE-CONTROLLED OSCILLATORS

CROSS-REFERENCE TO RELATED APPLICATIONS

This application is a continuation of international (WO) patent application no. PCT/DE2013/200016, filed 23 May 2013, which claims the priority of German (DE) patent application no. 10 2012 104 472.4, filed 23 May 2012, the contents of each being hereby incorporated herein by reference.

FIELD OF THE INVENTION

The present invention in principle relates to the technical field of activating at least one voltage-controlled oscillator for clock and/or data recovery circuits (CDR=Clock and Data Recovery); more specifically the present invention relates to a circuit arrangement as well as to a method for calibrating at least one activation signal provided for a voltage-controlled oscillator.

FIELD OF THE INVENTION

With circuits of this kind for clock and/or data recovery or CDR circuits a distinction is made, in principle, between the types of phase detector:
linear phase detector:
the linear phase difference at both inputs of the phase detector is indicated at the output of the phase detector;
binary phase detector:
the plus/minus sign of the phase difference between the two inputs of the phase detector is ascertained at the output of the phase detector (leading or trailing); this may be indicated, for example, by two digital phase detector output signals: "up" (for leading) and "down" (for trailing) or by a phase detector output signal which can assume three different output levels, for example 200 millivolt for leading, 400 millivolt for a phase difference equal zero and 600 millivolt for trailing; it is characteristic of binary phase detectors that the level of the output voltage does not supply any information on the actual phase difference at the inputs of the phase detector—a distinction is made only between a phase difference smaller than zero, a phase difference equal to zero, a phase difference greater than zero.

CDR circuits with binary phase detectors are frequently used for data transmissions in a frequency range greater than one Gigahertz, for they are easier to implement for a limited speed of the technology used and show a very robust behaviour (better so-called power supply rejection).

Further with the implementation of CDR circuits it is normal to use a voltage-controlled oscillator (VCO) with two tuning inputs in order to implement smaller on-chip capacitances in the required loop filter of the CDR circuit and further, in order to improve the phase noise of the CDR circuit.

FIG. 1 shows a first example for a voltage-controlled ring oscillator RO with two tuning inputs Vtune1, Vtune2 from the prior art. The frequency of this voltage-controlled oscillator RO can be set separately via the two tuning inputs Vtune1 and Vtune2. The frequency change is set by four separate varactor diodes D1, D2, D3, D4.

FIG. 2 shows a second example for a voltage-controlled ring oscillator RO' with two tuning inputs Vtune1, Vtune2 from the prior art. The first tuning input Vtune1 is usually used for a rough adjustment of the voltage-controlled oscillator RO', wherein the amperage I1 of a first current source SQ1' results in $I1=I_{D[irect]C[urrent]}$+conductive value*Vtune1, and the amperage I2 of a second current source SQ2' results in $I2=I_{D[irect]C[current]}$−conductive value*Vtune1.

These two digital signals up and dnb are used to carry out a fine adjustment of the voltage-controlled oscillator RO'. up and dnb may be the digital output signals of a binary phase detector.

FIG. 3 shows the frequency-tuning range of the voltage-controlled oscillator RO' from FIG. 2, if for example the voltage at up or at dnb is changed from 100 millivolt to one volt (=right axis). Since the two tuning signals up and dnb are usually of a digital nature, the oscillator RO' comprises three different output frequencies:
up=0, dnb=1: output frequency f0;
up=1, dnb=1: output frequency f0−df;
up=1, dnb=0: output frequency f0;
up=0, dnb=0: output frequency f0+df.

The disadvantages of the conventional solutions described by way of the two examples of FIG. 1 to FIG. 3 are, on the one hand, high energy consumption because of the generation of two digital signals up and dnb, and on the other a low output frequency because four varactors D1, D2, D3, D4 (see first example in FIG. 1)/D1', D2', D3', D4' are required (see second example in FIG. 2 and FIG. 3) resulting in the generation of more parasitic capacitance in the oscillator RO/oscillator R0'.

OBJECTS AND SUMMARY OF THE INVENTION

Starting from the above-explained disadvantages and inadequacies as well as taking the outlined prior art into account the object of the present invention is to further develop a circuit arrangement of the above-mentioned type as well as a method of the above-mentioned type in such a way that the expenditure of energy is as low as possible and the output frequency is as high as possible.

This object is achieved by a circuit arrangement according to the invention with the herein described features as well as by a method according to the invention with the herein described features. Advantageous embodiments and expedient further developments of the present invention are described above and below.

This object is achieved by a circuit arrangement for calibrating at least one activation signal provided for a voltage-controlled oscillator, which circuit arrangement comprises:
at least one calibration oscillator,
at least one reference oscillator associated with the calibration oscillator,
at least one clock counter arranged downstream of the calibration oscillator and the reference oscillator for counting the respective number of clock cycles of the calibration oscillator and the reference oscillator as well as for integrating a clock error resulting from the difference between these two clock cycles, and
at least one digital/analogue converter arranged downstream of the clock counter for converting the clock error into analogue tuning signals, from which the calibrated activation signal can be derived.

This object is further achieved by an embodiment of the circuit arrangement according to the invention, wherein the voltage-controlled oscillator comprises:

a first varactor, the cathodic connection of which is connected with the source contact or emitter connection of a first transistor as well as with the drain contact or collector connection of a second transistor, and a second varactor, the cathode connection of which is connected with the source contact or emitter connection of a third transistor as well as with the drain contact or collector connection of a fourth transistor.

This object is further achieved by an embodiment of the circuit arrangement according to the invention, wherein the source contact or emitter connection of the second transistor and the source contact or emitter connection of the fourth transistor are connected with each other as well as with at least one current source.

This object is further achieved by an embodiment of the circuit arrangement according to the invention,
wherein the gate contact or basis connection of the first transistor and the gate contact or basis connection of the third transistor are connected with each other and that a bias voltage can be applied to them, and wherein the drain contact or collector connection of the first transistor and the drain contact or collector connection of the third transistor provide the output signal of the voltage-controlled oscillator.

This object is further achieved by an embodiment of the circuit arrangement according to the invention, wherein the calibrated activation signal may be applied to the anodic connection of the first varactor of the voltage-controlled oscillator and to the anodic connection of the second varactor of the voltage-controlled oscillator.

This object is further achieved by an embodiment of the circuit arrangement according to the invention, wherein the reference oscillator comprises:

a first varactor, to the anodic connection of which a reference potential, in particular earth potential or ground potential or zero potential may be applied, as well as a second varactor, to the anodic connection of which the reference potential may be applied, wherein the cathodic connection of the first varactor and the cathodic connection of the second varactor are connected with each other, with the source contact or emitter connection of a first transistor as well as with the drain contact or collector connection of a second transistor, and a third varactor, to the anodic connection of which the reference potential may be applied, as well as a fourth varactor, to the anodic connection of which the reference potential may be applied, wherein the cathodic connection of the third varactor and the cathodic connection of the fourth varactor are connected with each other, with the source contact or emitter connection of a third transistor as well as with the drain contact or collector connection of a fourth transistor.

This object is further achieved by an embodiment of the circuit arrangement according to the invention, wherein the source contact or emitter connection of the second transistor and the source contact or emitter connection of the fourth transistor are connected with each other as well as with at least one current source.

This object is further achieved by an embodiment of the circuit arrangement according to the invention,
wherein the gate contact or basis connection of the first transistor and the gate contact or basis connection of the third transistor are connected with each other and in that a bias voltage can be applied to them, and wherein the drain contact or collector connection of the first transistor and the drain contact or collector connection of the third transistor provide the output signal of the reference oscillator.

This object is further achieved by an embodiment of the circuit arrangement according to the invention, wherein the calibration oscillator comprises:

a first varactor, to the anodic connection of which a first of the tuning signals and a second of the tuning signals can be applied, as well as a second varactor, to the anodic connection of which the first tuning signal and a third of the tuning signals can be applied, wherein the cathodic connection of the first varactor and the cathodic connection of the second varactor are connected with each other, with the source contact or emitter connection of a first transistor as well as with the drain contact or collector connection of the second transistor, and a third varactor, to the anodic connection of which the first tuning signal and the second tuning signal can be applied, as well as a fourth varactor, to the anodic connection of which the first tuning signal and the third tuning signal can be applied, wherein the cathodic connection of the third varactor and the cathodic connection of the fourth varactor are connected with each other, with the source contact or emitter connection of a third transistor as well as with the drain contact or collector connection of a fourth transistor.

This object is further achieved by an embodiment of the circuit arrangement according to the invention, wherein the source contact or emitter connection of the second transistor and the source contact or emitter connection of the fourth transistor are connected with each other and with at least one current source.

This object is further achieved by an embodiment of the circuit arrangement according to the invention,
wherein the gate contact or basis connection of the first transistor and the gate contact or basis connection of the third transistor are connected with each other and to which a bias voltage can be applied, and wherein the drain contact or collector connection of the first transistor and the drain contact or collector connection of the third transistor provide the output signal of the calibration oscillator.

This object is further achieved by an embodiment of the circuit arrangement according to the invention,
wherein a first calibrated activation signal corresponds to the first tuning signal, in particular constitutes the first tuning signal, wherein a second calibrated activation signal corresponds to the second tuning signal, in particular constitutes the second tuning signal, and wherein a third calibrated activation signal corresponds to the third tuning signal, in particular constitutes the third tuning signal.

This object is further achieved by a method for calibrating at least one activation signal provided for a voltage-controlled oscillator,
wherein the respective number of clock cycles of at least one calibration oscillator and of at least one reference oscillator associated with the calibration oscillator is counted by means of at least one clock counter arranged downstream of the calibration oscillator and the reference oscillator, and a clock error resulting from the difference between these two numbers of clock cycles is integrated, and wherein the clock error is converted by means of at least one digital/analogue converter arranged downstream of the clock counter into analogue tuning signals, from which the calibrated activation signal is derived.

This object is further achieved by an embodiment of the method according to the invention, wherein a first calibrated activation signal corresponds to a first of the tuning signals, in particular constitutes a first of the tuning signals, wherein a second calibrated activation signal corresponds to a second of the tuning signals, in particular constitutes a second of the tuning signals, and wherein a third calibrated activation signal corresponds to a third of the tuning signals, in particular constitutes a third of the tuning signals.

This object is further achieved by a use of the circuit arrangement and/or of the method according to the invention for activating at least one voltage-controlled oscillator for at least one circuit for clock and data recovery with at least one binary phase detector.

According to the invention at least one voltage-controlled oscillator (VCO) for at least one circuit for clock and data recovery (CDR), which comprises at least one binary phase detector (so-called bang-bang phase detector or upward/downward phase detector), is activated in such a way that not four but only two varactor diodes or tuning diodes or capacitance diodes or varicaps are required, wherein the frequency change is achieved, no longer with two activation signals but only with one activation signal.

This means that it is possible to realise a low power demand, i.e. a low energy consumption, for due to lower parasitic capacitance than in the state of the art less current is required in order to achieve the same output frequency. On the other hand it is possible to realise a higher output frequency, for because of only two varactors (instead of four varactors in the state of the art) less parasitic capacitance is generated in the voltage-controlled oscillator allowing the layout of the voltage-controlled oscillator to be designed in a more compact manner.

Finally the present invention relates to the use of at least one circuit arrangement according to the above-described type and/or a method according to the above-described type for activating at least one voltage-controlled oscillator (VCO) for at least one circuit for clock and data recovery (CDR) with at least one binary phase detector (so-called bang-bang phase detector or upward/downward phase detector).

BRIEF DESCRIPTION OF THE DRAWINGS

As already discussed above, there are various possibilities for embodying and further developing the teaching of the present invention in an advantageous manner. For this purpose, on the one hand reference is made to the explanations above as well as to the dependent claims, and on the other hand further embodiments, features and advantages of the present invention are explained in greater detail below, inter alia by way of the exemplary embodiment illustrated by FIG. 4 to FIG. 10.

It is shown in:

FIG. 1 in a conceptual schematic view a first example of a prior art voltage-controlled oscillator which operates according to the prior art method;

FIG. 2 in a conceptual schematic view a second example of a prior art voltage-controlled oscillator which operates according to the prior art method;

FIG. 3 in a diagrammatic view the typical frequency-tuning characteristic of the voltage-controlled oscillator of FIG. 2, wherein the activation voltage is plotted on the right axis;

Like or similar embodiments, elements or features are provided with identical reference numerals in FIG. 1 to FIG. 10.

DETAILED DESCRIPTION OF THE INVENTION

Figure 4:
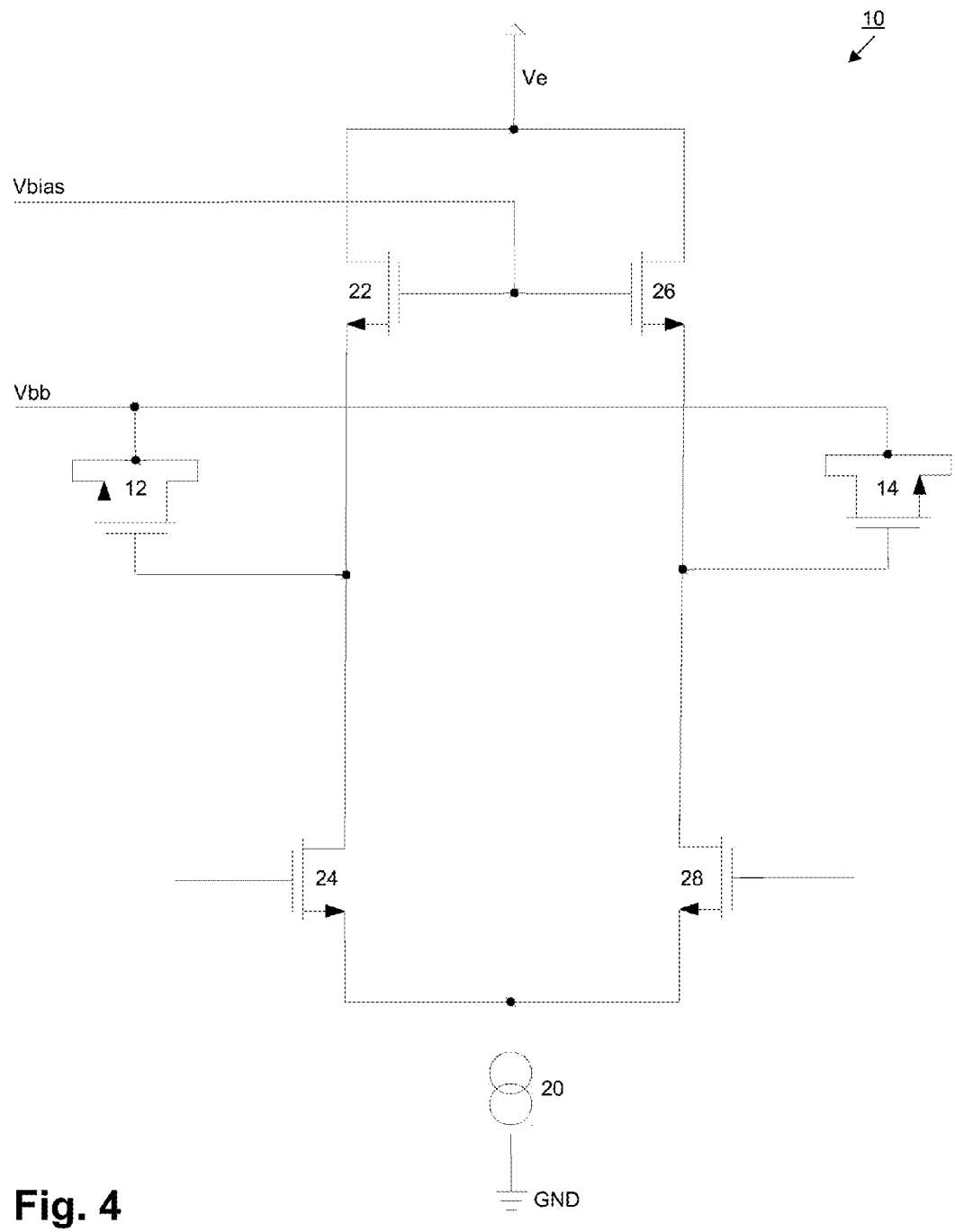
FIG. 4 in a conceptual schematic view an embodiment of a voltage-controlled oscillator, which is part of the circuit arrangement according to the invention of FIG. 7 and which operates according to the method according to the present invention.

FIG. 4 shows an embodiment of a voltage-controlled ring oscillator 10. The frequency of this voltage-controlled oscillator 10 can be adjusted, in contrast to the state of the art (see FIG. 1, FIG. 2) according to which two tuning inputs are required, via a calibrated activation signal Vbb. Here the frequency change is set by two varactor diodes or tuning diodes or capacitance diodes or varicaps 12, 14.

FIG. 4 reveals that the anodic connection of the first varactor 12 of the voltage-controlled oscillator 10 and the anodic connection of the second varactor 14 of the voltage-controlled oscillator 10 have the calibrated activation signal Vbb applied to them.

The cathodic connection of the first varactor 12 is connected with the source contact or emitter connection of the first transistor 22 of the voltage-controlled oscillator 10 as well as with the drain contact or collector connection of a second transistor 24 of the voltage-controlled oscillator 10, and the cathodic connection of the second varactor 14 is connected with the source contact or emitter connection of a third transistor 26 of the voltage-controlled oscillator 10 as well as with the drain contact or collector connection of a fourth transistor 28 of the voltage-controlled oscillator 10.

The source contact or emitter connection of the second transistor 24 and the source contact or emitter connection of the fourth transistor 28 are connected with each other as well as with a current source 20. The gate contact or basis connection of the first transistor 22 and the gate contact or basis connection of the third transistor 26 are connected with each other and have a bias voltage Vbias applied them. The drain contact or collector connection of the first transistor 22 and the drain contact or collector connection of the third transistor 26 provide the output signal Ve of the voltage-controlled oscillator 10.

Figure 5:
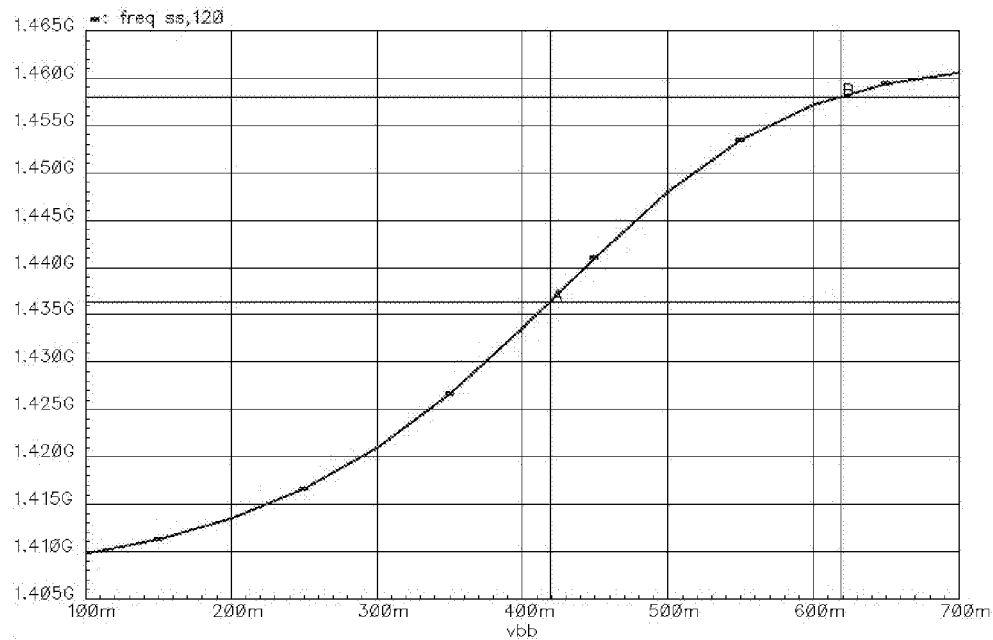
FIG. 5 in a diagrammatic view the typical frequency-tuning characteristic of the voltage-controlled oscillator of FIG. 4, wherein the activation voltage is plotted on the right axis.
Figure 6:
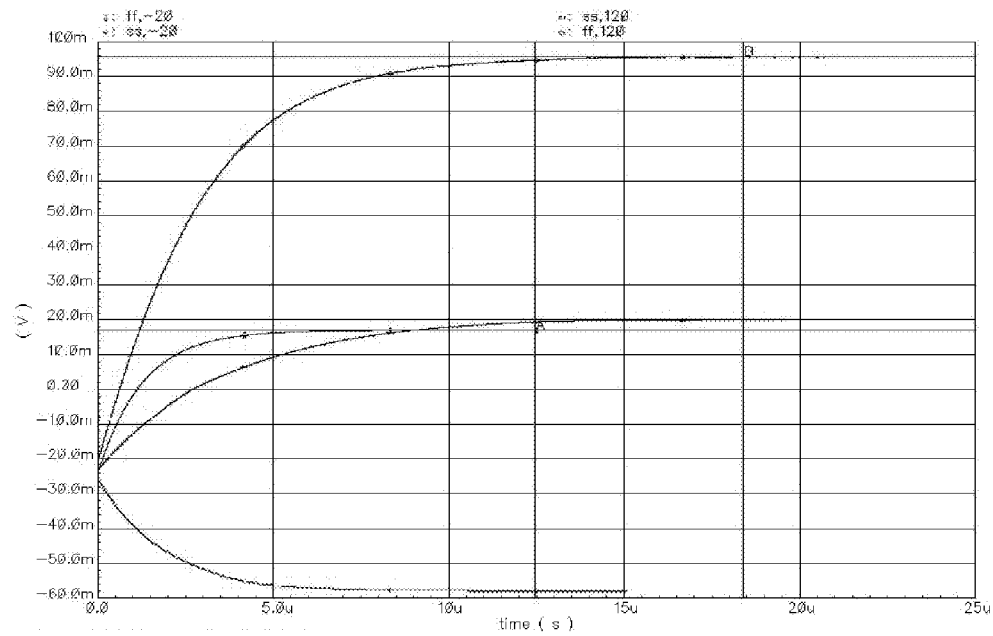
FIG. 6 in a diagrammatic view operating-parameter-dependent deviations from the frequency-tuning characteristic of FIG. 5.

FIG. 5 shows the typical frequency-tuning characteristic, if the activation voltage Vbb is varied in the range from 100 millivolt to 700 millivolt. The oscillator 10 now receives three discrete voltages at the tuning input Vbb, generated in accordance with the output of the binary phase detector, and uses them to generate three discrete output frequencies:

tuning voltage Vbb=200 millivolt→output frequency f0−df;

tuning voltage Vbb=400 millivolt→output frequency f0;

tuning voltage Vbb=600 millivolt→output frequency f0+df;

The frequency-tuning characteristic changes via the operating parameters such as technology, supply voltage and temperature. This behaviour is shown in FIG. 6, which shows an activation voltage Vbb of approximately 495 millivolt instead of 400 millivolt for optimally adjusting the output frequency f0, i.e. the deviation of Vbb=400 millivolt is approximately 95 millivolt, for example, for a chip temperature of 120 degree Celsius.

Figure 7:
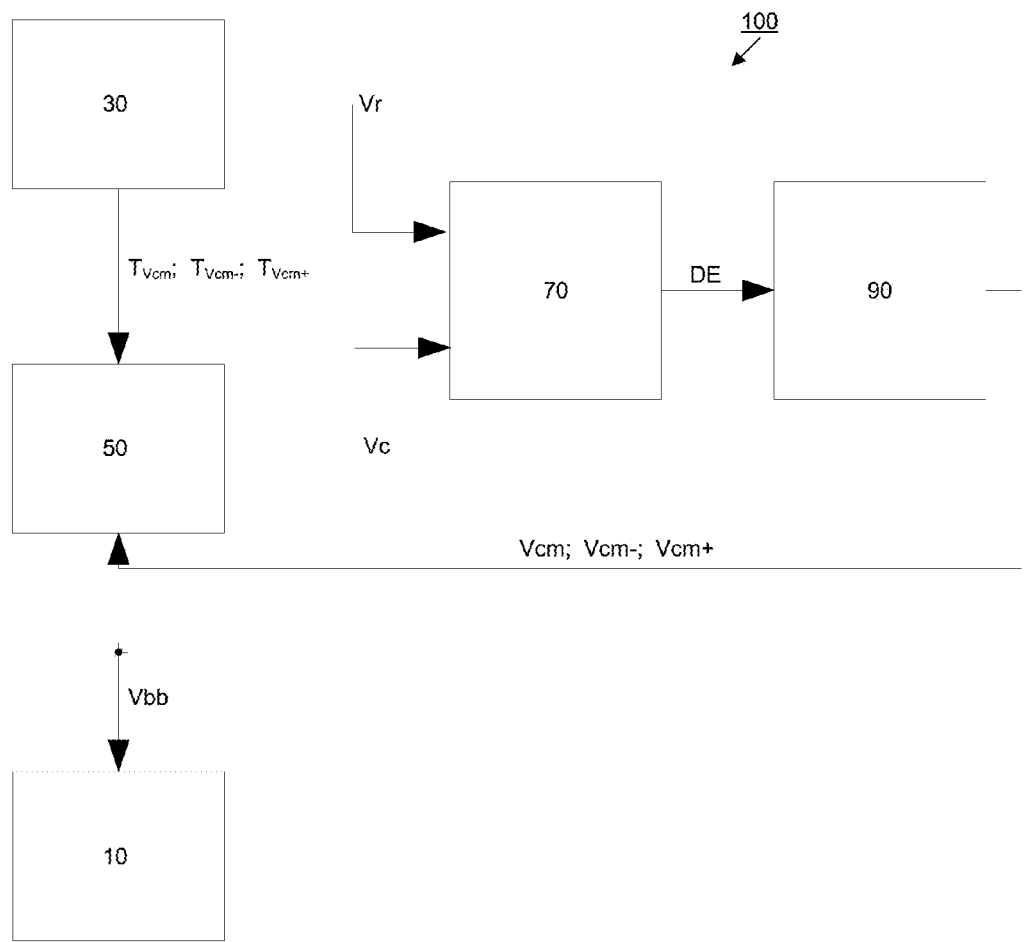
FIG. 7 in a conceptual schematic view an embodiment of a circuit arrangement according to the present invention, which operates according to the method according to the invention.

Now, in order to generate the correct tuning voltage Vbb for all operating parameters, the present invention comprises a calibration oscillator 100 as illustrated by way of an embodiment in FIG. 7.

The calibration circuit 100 according to FIG. 7 comprises two additional oscillators 30, 50 of essentially identical construction such as the main oscillator 10 described above with reference to FIG. 4. However, these two additional oscillators 30, 50 may be operated at a substantially lower frequency and thus for a substantially lower current consumption than the main oscillator 10; notwithstanding these two additional oscillators 30, 50 comprise essentially the same tuning characteristics as the main oscillator 10.

Figure 8:
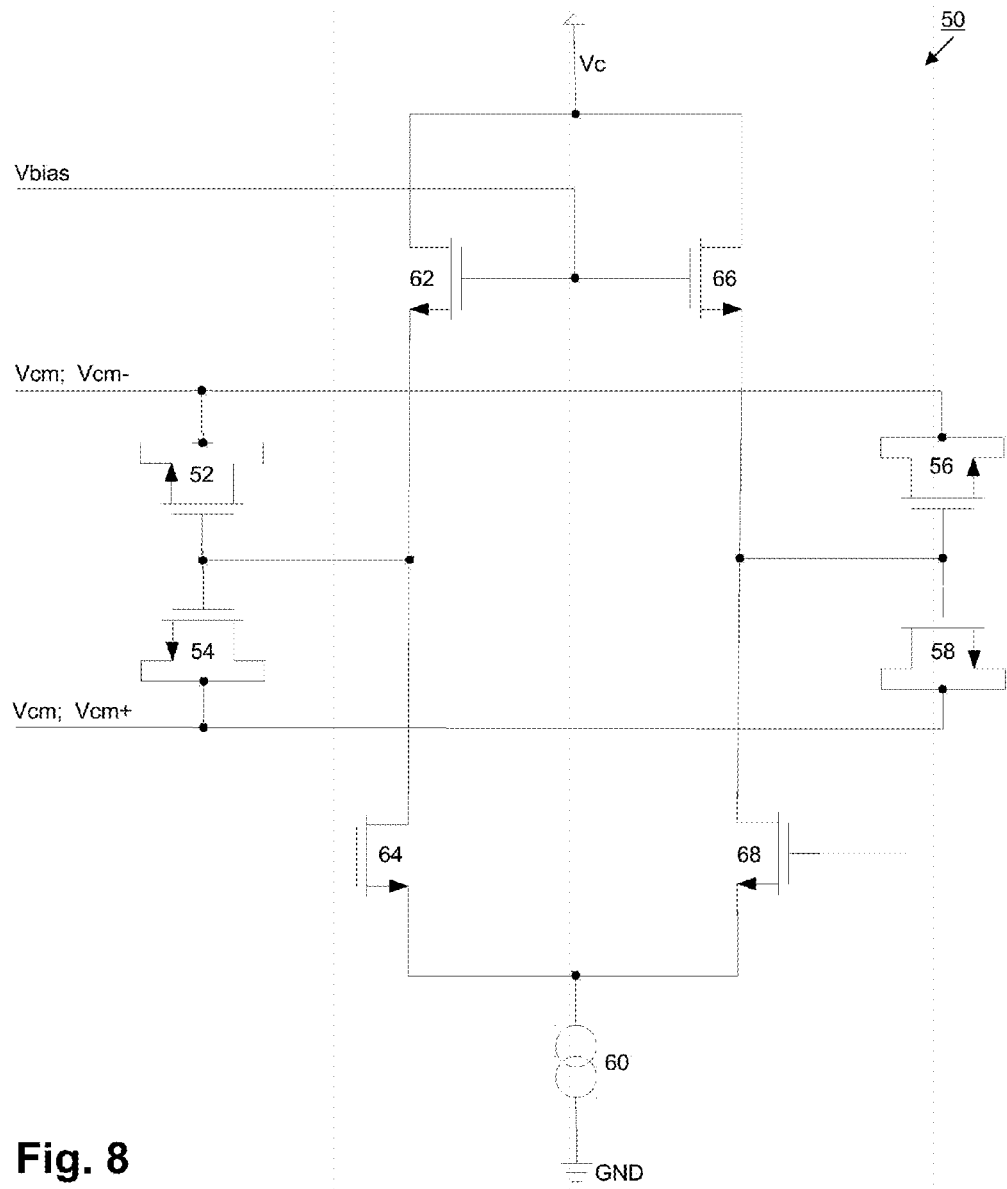
FIG. 8 in a conceptual schematic view an embodiment of a calibration oscillator, which is part of the circuit arrangement according to the invention of FIG. 7 and which operates according to the method of the present invention.

One of the two additional oscillators 30, 50 is a calibration oscillator 50 shown by way of example in FIG. 8, which for the time period Tref in turn receives a first tuning voltage Vcm of approximately 400 millivolt, then a third tuning voltage Vcm+ of approximately 600 millivolt (=Vcm+200 millivolt) and thereafter a second tuning voltage Vcm− of approximately 200 millivolt (=Vcm−200 millivolt).

The anodic connection of a first varactor 52 of the calibration oscillator 50 has the first tuning voltage Vcm and the second tuning voltage Vcm− applied to it, and the anodic connection of a second varactor 54 of the calibration oscillator 50 has the first tuning voltage Vcm and the third tuning voltage Vcm+ applied to it.

The cathodic connection of the first varactor 52 and the cathodic connection of the second varactor 54 are connected with each other, with the source contact or emitter connection of a first transistor 62 of the calibration oscillator 50 as well as with the drain contact or collector connection of a second transistor 64 of the calibration oscillator 50.

The anodic connection of a third varactor 56 of the calibration oscillator 50 has the first tuning voltage Vcm and the second tuning voltage Vcm− applied to it, and the anodic connection of a fourth varactor 58 of the has the first tuning voltage Vcm and the third tuning voltage Vcm+ applied to it.

The cathodic connection of the third varactor 56 and the cathodic connection of the fourth varactor 58 are connected with each other, with the source contact or emitter connection of a third transistor 66 of the calibration oscillator 50 as well as with the drain contact or collector connection of a fourth transistor 68 of the calibration oscillator 50.

The source contact or emitter connection of the second varactor 64 and the source contact or emitter connection of the fourth transistor 68 are connected with each other as well as with a current source 60. The gate contact or basis connection of the first transistor 62 and the gate contact or basis connection of the third transistor 66 are connected with each other and have a bias voltage Vbias applied to them. The drain contact or collector connection of the first transistor 62 and the drain contact or collector connection of the third transistor 66 provide the output signal Vc of the calibration oscillator 50.

Figure 9:
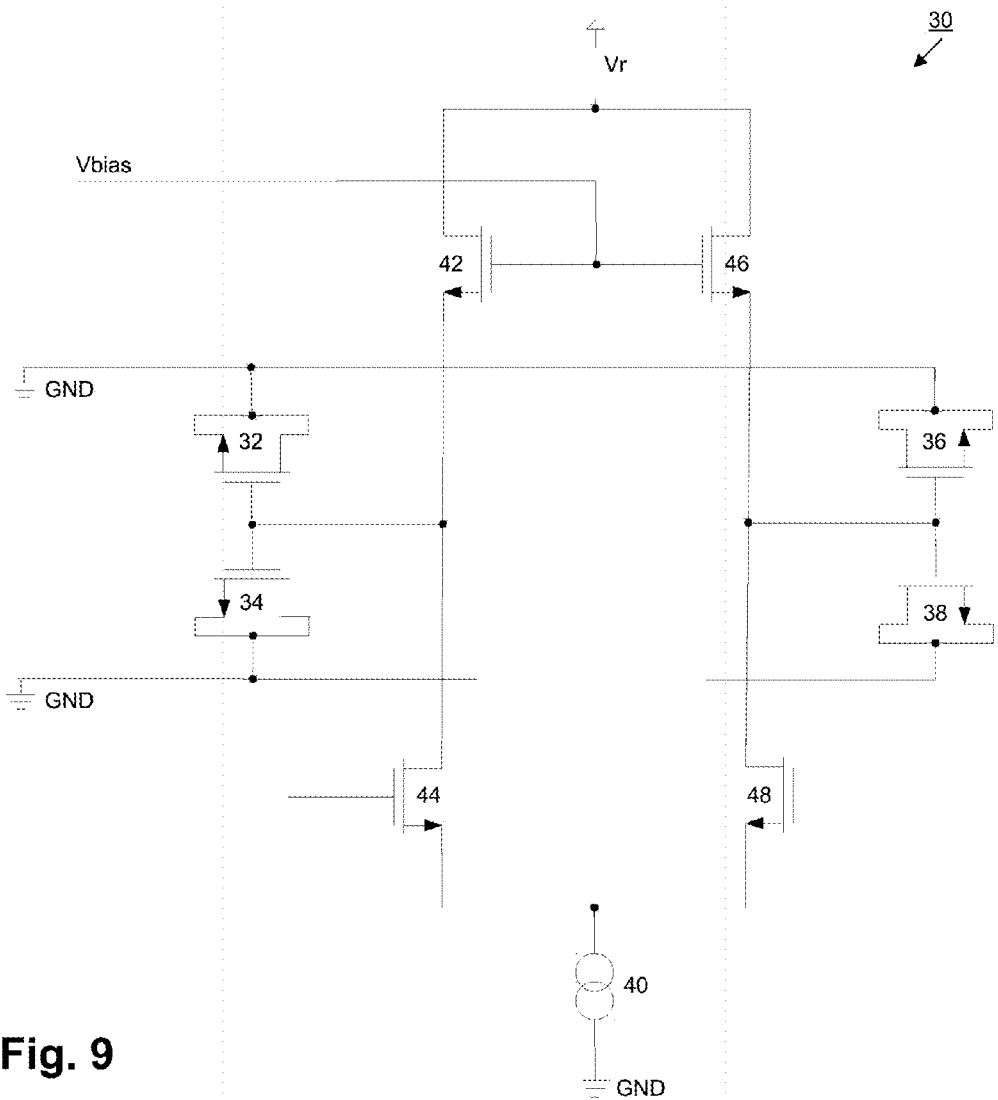
FIG. 9 in a conceptual schematic view an embodiment of a reference oscillator, which is part of the circuit arrangement according to the invention of FIG. 7 and which operates according to the method of the present invention.

The other of the two additional oscillators 30, 50 is a reference oscillator 30 shown by way of example in FIG. 9, which as regards clocking is associated with the calibration oscillator 50.

The anodic connection of a first varactor 32 of the reference oscillator 30 and the anodic connection of a second varactor 34 of the reference oscillator 30 have a reference potential GND, i.e. earth potential or ground potential or zero potential applied to them.

The cathodic connection of the first varactor 32 and the cathodic connection of the second varactor 34 are connected with each other, with the source contact or emitter connection of a first transistor 42 of the reference oscillator 30 as well as with the drain contact or collector connection of a second transistor 44 of the reference oscillator 30.

The anodic connection of a third varactor 36 of the reference oscillator 30 and the anodic connection of a fourth varactor 38 of the reference oscillator 30 have the reference potential GND, i.e. earth potential or ground potential or zero potential applied to them.

The cathode connection of the third varactor 36 and the cathode connection of the fourth varactor are connected with each other, with the source contact or emitter connection of the third transistor 46 of the reference oscillator 30 as well as with the drain contact or collector connection of a fourth transistor 48 of the reference oscillator 30.

The source contact or emitter connection of the second transistor 44 and the source contact or emitter connection of the fourth transistor are connected with each other as well as with a current source 40. The gate contact or basis connection of the first transistor 42 and the gate contact or basis connection of the third transistor 46 are connected with each other and have a bias voltage Vbias applied to them. The drain contact or collector connection of the first transistor 42 and the drain contact or collector connection of the third transistor 46 provide the output signal Vr of the reference oscillator 30.

The above-mentioned varactor diodes or tuning diodes or capacitance diodes or varicaps 12, 14, 32, 34, 36, 38, 52, 54, 56, 58 are electronic semiconductor components, for which, by changing the applied voltage, a variation in capacitance of for example 10 to 1 can be obtained so that an electrically controllable capacitance is available.

Part of the above-mentioned transistors 22, 24, 26, 28, 42, 44, 46, 48, 62, 64, 66, 68 or all above-mentioned transistors 22, 24, 26, 28, 42, 44, 46, 48, 62, 64, 66, 68 may, in particular, be configured as field effect transistors (FET), for example as metal oxide semiconductor field effect transistors (MOSFET, such as n-type metal oxide semiconductor field effect transistors (n-type MOSFETs).

A clock counter 70 (so-called clock cycle error counter) arranged downstream of the calibration oscillator 50 as well as of the reference oscillator 30 compares the respective number N of clock cycles of the calibration oscillator 50/the reference oscillator 30 on the basis of the output signal Vc of the calibration oscillator 50 and of the output signal Vr of the reference oscillator 30, and forms the difference.

The clock error (so-called clock-cycle error) resulting from the difference of these two clock cycles N is integrated in the clock counter 70 and provided as a digital bus signal to a digital/analogue converter 90 arranged downstream of the clock counter 70, as input signal. The digital/analogue converter 90 converts the clock error DE into an analogue signal which sets the tuning voltage Vcm, Vcm−, Vcm+ in the calibration oscillator 50 to the correct value.

Figure 10:
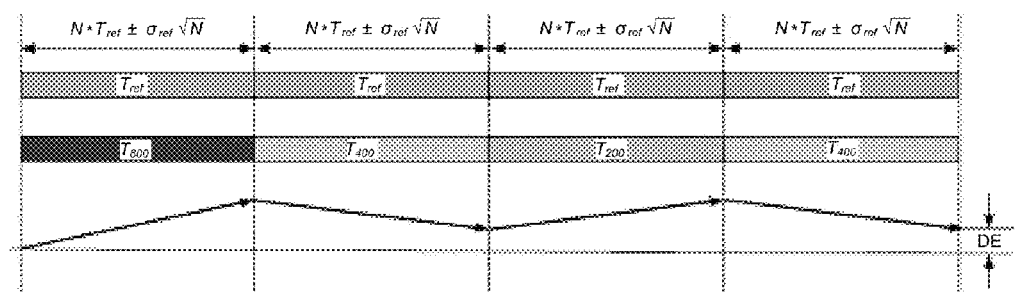
FIG. 10 in a diagrammatic view a visual illustration of the calculations of the circuit arrangement of FIG. 7.

FIG. 10 illustrates, by way of example, the calculations of the calibration circuit 100, in particular accuracy, standard deviation a, required counter length of the clock counter 70, bit width of the digital/analogue converter 90 etc.

With this arrangement
the uppermost line in FIG. 10 shows the signal length over time $N*T_{ref} \pm \sigma_{ref}*N^{0,5}$ indicated by a double arrow,
the second uppermost line shows the function of the reference oscillator 30 counting N cycles,
the last but one line shows the function of the calibration oscillator 50 shifting the frequency and
the last line shows the function of the digital integrator within the clock counter 70.

The resulting number $N_{count@600}$ of clock cycles) during the tuning voltage Vcm+200 millivolt (=approximately 600 millivolt) is $N_{count@600}=[N*T_{ref} \pm \sigma_{ref}*N^{0,5} \pm \sigma_{600}*(N*T_{ref}/T_{600})^{0,5}]/T_{600}$; correspondingly the resulting number $N_{count@400}$ of clock cycles during the tuning voltage Vcm (=approximately 400 millivolt) is $N_{count@400}=[N*T_{ref} \pm 2*\sigma_{ref}*N^{0,5}]/T_{400}$, and the resulting number $N_{count@200}$ of clock cycles during the tuning voltage Vcm−200 millivolt (=approximately 200 millivolt) is $N_{count@200}=[N*T_{ref} \pm \sigma_{ref}*N^{0,5} \pm \sigma_{200}*(N*T_{ref}/T_{200})^{0,5}]/T_{200}$.

If the reference oscillator 30 is of the same type as the calibration oscillator 50, the jitter performance is the same, so that the above formula reads: $\sigma_{600}*(N*T_{ref}/T_{600})^{0,5}=\sigma_{ref}*N^{0,5}$ or $\sigma_{400}*(N*T_{ref}/T_{400})^{0,5}=\sigma_{ref}*N^{0,5}$ or $\sigma_{200}*(N*T_{ref}/T_{200})^{0,5}=\sigma_{ref}*N^{0,5}$.

In this case the number $N_{count@600}$ of clock cycles during the tuning voltage Vcm+200 millivolt (=approximately 600 millivolt) results in the number $N_{count@600}=[N*T_{ref} \pm 2*\sigma_{ref}*N^{0,5}]/T_{600}$; correspondingly the number $N_{count@400}$ of clock cycles during the tuning voltage Vcm (=approximately 400 millivolt) results in the number $N_{count@400}=[N*T_{ref} \pm 2*\sigma_{ref}*N^{0,5}]/T_{400}$, and the number $N_{count@200}$ of clock cycles during the tuning voltage Vcm−200 millivolt (=approximately 200 millivolt) results in the number $N_{count@200}=[N*T_{ref} \pm 2*\sigma_{ref}*N^{0,5}]/T_{200}$.

The digital integrator within the clock counter 70, taking into account the digital error DE, outputs the total number $N_{count@600}-N_{count@400}+N_{count@200}-N_{count@400}=[N*T_{ref} \pm 2*\sigma_{ref}*N^{0,5}]/T_{600}-[N*T_{ref} \pm 2*\sigma_{ref}*N^{0,5}]/T_{400}$ $[N*T_{ref} \pm 2*\sigma_{ref}*N^{0,5}]/T_{200}-[N*T_{ref} \pm 2*\sigma_{ref}*N^{0,5}]/T_{400}$.

Now, since $\pm 2*\sigma_{ref}*N^{0,5}/T_{600} \pm 2*\sigma_{ref}*N^{0,5}/T_{400} \pm 2*\sigma_{ref}*N^{0,5}/T_{200} \pm 2*\sigma_{ref}*N^{0,5}/T_{400}=\pm 8*\sigma_{ref}*N^{0,5}/T_{400}$, the resulting frequency deviation is $\Delta f_{600-400}-\Delta f_{400-200}=1/T_{600}-1/T_{400}-(1/T_{400}-1/T_{200})=1/T_{600}-1/T_{400}+1/T_{200}-1/T_{400}=\pm 8*\sigma_{ref}/(T_{ref}*T_{400}*N^{0,5})$.

LIST OF REFERENCE NUMERALS 100 circuit arrangement, in particular calibration circuit
10 voltage-controlled oscillator, in particular voltage-controlled ring oscillator
12 first varactor of the voltage-controlled oscillator 10
14 second varactor of the voltage-controlled oscillator 10
20 current source of the voltage-controlled oscillator 10
22 first transistor of the voltage-controlled oscillator 10
24 second transistor of the voltage-controlled oscillator 10
26 third transistor of the voltage-controlled oscillator 10
28 fourth transistor of the voltage-controlled oscillator 10
30 reference oscillator
32 first varactor of the reference oscillator 30
34 second varactor of the reference oscillator 30
36 third varactor of the reference oscillator 30
38 fourth varactor of the reference oscillator 30
40 current source of the reference oscillators 30
42 first transistor of the reference oscillator 30
44 second transistor of the reference oscillator 30
46 third transistor of the reference oscillator 30
48 fourth transistor of the reference oscillator 30
50 calibration oscillator
52 first varactor of the calibration oscillator 50
54 second varactor of the calibration oscillator 50
56 third varactor of the calibration oscillator 50
58 fourth varactor of the calibration oscillator 50
60 current source of the calibration oscillator 50
62 first transistor of the calibration oscillator 50
64 second transistor of the calibration oscillator 50
66 third transistor of the calibration oscillator 50
68 fourth transistor of the calibration oscillator 50
70 clock cycle counter
90 digital/analogue converter
D1 first varactor of the voltage-controlled oscillator RO (=prior art; see FIG. 1)
D1' first varactor of the voltage-controlled oscillator RO' (=prior art; see FIG. 2)
D2 second varactor of the voltage-controlled oscillator RO (=prior art; see FIG. 1)
D2' second varactor of the voltage-controlled oscillator RO' (=prior art; see FIG. 2)
D3 third varactor of the voltage-controlled oscillator RO (=prior art; see FIG. 1)
D3' third varactor of the voltage-controlled oscillator RO' (=prior art; see FIG. 2)
D4 fourth varactor of the voltage-controlled oscillator RO (=prior art; see FIG. 1)
D4' fourth varactor of the voltage-controlled oscillator RO' (=prior art; see FIG. 2)
DE clock cycle error, in particular digital clock cycle error
dnb second digital signal for fine tuning the voltage-controlled oscillator RO' (=prior art; see FIG. 2)
GND reference potential, in particular earth potential or ground potential or zero potential
amperage of the first current source SQ1' (=prior art; see FIG. 2)
amperage of the second current source SQ2' (=prior art; see FIG. 2)
N number of clock cycles
RO voltage-controlled oscillator, in particular voltage-controlled ring oscillator (=prior art; see FIG. 1)
RO' voltage-controlled oscillator, in particular voltage-controlled ring oscillator (=prior art; see FIG. 2)
SQ current source of the voltage-controlled oscillator RO (=prior art; see FIG. 1)
SQ1' first current source of the voltage-controlled oscillator RO' (=prior art; see FIG. 2)
SQ2' second current source of the voltage-controlled oscillator RO' (=prior art; see FIG. 2)
Tref time or time span
T1 first transistor of the voltage-controlled oscillator RO (=prior art; see FIG. 1)
T1' first transistor of the voltage-controlled oscillator RO' (=prior art; see FIG. 2)

T2 second transistor of the voltage-controlled oscillator RO (=prior art; see FIG. 1)
T2' second transistor of the voltage-controlled oscillator RO' (=prior art; see FIG. 2)
T3 third transistor of the voltage-controlled oscillator RO (=prior art; see FIG. 1)
T3' third transistor of the voltage-controlled oscillator RO' (=prior art; see FIG. 2)
T4 fourth transistor of the voltage-controlled oscillator RO (=prior art; see FIG. 1)
T4' fourth transistor of the voltage-controlled oscillator RO' (=prior art; see FIG. 2)
T5' fifth transistor of the voltage-controlled oscillator RO' (=prior art; see FIG. 2)
T6' sixth transistor of the voltage-controlled oscillator RO' (=prior art; see FIG. 2)
up first digital signal for fine tuning of the voltage-controlled oscillator RO' (=prior art; see FIG. 2)
Vbb activation signal of the voltage-controlled oscillator 10
Vbias bias voltage
Vc output signal of the calibration oscillator 50
Vcm first tuning signal of the calibration oscillator 50
Vcm− second tuning signal of the calibration oscillator 50
Vcm+ third tuning signal of the calibration oscillator 50
Ve output signal of the voltage-controlled oscillator 10
Vr output signal of the reference oscillators 30
Vtune1 first tuning input (=prior art; see FIG. 1 and FIG. 2)
Vtune2 second tuning input (=prior art; see FIG. 1)

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

What is claimed is:

1. A circuit arrangement for calibrating at least one activation signal provided for a voltage-controlled oscillator, which circuit arrangement comprises:
    at least one calibration oscillator,
    at least one reference oscillator associated with the calibration oscillator,
    at least one clock counter arranged downstream of the calibration oscillator and the reference oscillator for counting the respective number of clock cycles of the calibration oscillator and the reference oscillator as well as for integrating a clock error resulting from the difference between these two clock cycles, and
    at least one digital/analogue converter arranged downstream of the clock counter for converting the clock error into analogue tuning signals, from which the calibrated activation signal can be derived,
    wherein the voltage-controlled oscillator comprises:
    a first varactor, the cathodic connection of which is connected with the source contact or emitter connection of a first transistor as well as with the drain contact or collector connection of a second transistor, and
    a second varactor, the cathode connection of which is connected with the source contact or emitter connection of a third transistor as well as with the drain contact or collector connection of a fourth transistor.

2. The circuit arrangement according to claim 1, wherein the source contact or emitter connection of the second transistor and the source contact or emitter connection of the fourth transistor are connected with each other as well as with at least one current source.

3. The circuit arrangement according to claim 1,
    wherein the gate contact or basis connection of the first transistor and the gate contact or basis connection of the third transistor are connected with each other and that a bias voltage can be applied to them, and
    wherein the drain contact or collector connection of the first transistor and the drain contact or collector connection of the third transistor provide the output signal of the voltage-controlled oscillator.

4. The circuit arrangement according to claim 1, wherein the calibrated activation signal may be applied to the anodic connection of the first varactor of the voltage-controlled oscillator and to the anodic connection of the second varactor of the voltage-controlled oscillator.

5. A circuit arrangement for calibrating at least one activation signal provided for a voltage-controlled oscillator, which circuit arrangement comprises:
    at least one calibration oscillator,
    at least one reference oscillator associated with the calibration oscillator,
    at least one clock counter arranged downstream of the calibration oscillator and the reference oscillator for counting the respective number of clock cycles of the calibration oscillator and the reference oscillator as well as for integrating a clock error resulting from the difference between these two clock cycles, and
    at least one digital/analogue converter arranged downstream of the clock counter for converting the clock error into analogue tuning signals, from which the calibrated activation signal can be derived,
    wherein the reference oscillator comprises:
    a first varactor, to the anodic connection of which a reference potential may be applied, as well as
    a second varactor, to the anodic connection of which the reference potential may be applied,
    wherein the cathodic connection of the first varactor and the cathodic connection of the second varactor are connected with each other, with the source contact or emitter connection of a first transistor as well as with the drain contact or collector connection of a second transistor, and
    a third varactor, to the anodic connection of which the reference potential may be applied, as well as
    a fourth varactor, to the anodic connection of which the reference potential may be applied,
    wherein the cathodic connection of the third varactor and the cathodic connection of the fourth varactor are connected with each other, with the source contact or emitter connection of a third transistor as well as with the drain contact or collector connection of a fourth transistor.

6. The circuit arrangement according to claim 5, wherein the source contact or emitter connection of the second transistor and the source contact or emitter connection of the fourth transistor are connected with each other as well as with at least one current source.

7. The circuit arrangement according to claim 5,
    wherein the gate contact or basis connection of the first transistor and the gate contact or basis connection of the third transistor are connected with each other and in that a bias voltage can be applied to them, and
    wherein the drain contact or collector connection of the first transistor and the drain contact or collector connection of the third transistor provide the output signal of the reference oscillator.

8. A circuit arrangement for calibrating at least one activation signal provided for a voltage-controlled oscillator, which circuit arrangement comprises:
- at least one calibration oscillator,
- at least one reference oscillator associated with the calibration oscillator,
- at least one clock counter arranged downstream of the calibration oscillator and the reference oscillator for counting the respective number of clock cycles of the calibration oscillator and the reference oscillator as well as for integrating a clock error resulting from the difference between these two clock cycles, and
- at least one digital/analogue converter arranged downstream of the clock counter for converting the clock error into analogue tuning signals, from which the calibrated activation signal can be derived, wherein the calibration oscillator comprises:
- a first varactor, to the anodic connection of which a first of the tuning signals and a second of the tuning signals can be applied, as well as
- a second varactor, to the anodic connection of which the first tuning signal and a third of the tuning signals can be applied,
- wherein the cathodic connection of the first varactor and the cathodic connection of the second varactor are connected with each other, with the source contact or emitter connection of a first transistor as well as with the drain contact or collector connection of the second transistor, and
- a third varactor, to the anodic connection of which the first tuning signal and the second tuning signal can be applied, as well as
- a fourth varactor, to the anodic connection of which the first tuning signal and the third tuning signal can be applied,
- wherein the cathodic connection of the third varactor and the cathodic connection of the fourth varactor are connected with each other, with the source contact or emitter connection of a third transistor as well as with the drain contact or collector connection of a fourth transistor.

9. The circuit arrangement according to claim 8, wherein the source contact or emitter connection of the second transistor and the source contact or emitter connection of the fourth transistor are connected with each other and with at least one current source.

10. The circuit arrangement according to claim 8,
- wherein the gate contact or basis connection of the first transistor and the gate contact or basis connection of the third transistor are connected with each other and to which a bias voltage can be applied, and
- wherein the drain contact or collector connection of the first transistor and the drain contact or collector connection of the third transistor provide the output signal of the calibration oscillator.

11. The circuit arrangement according to claim 8,
- wherein a first calibrated activation signal corresponds to the first tuning signal,
- wherein a second calibrated activation signal corresponds to the second tuning signal, and
- wherein a third calibrated activation signal corresponds to the third tuning signal.

12. A method for calibrating at least one activation signal provided for a voltage-controlled oscillator by means of a circuit arrangement according to claim 1,
- wherein the respective number of clock cycles of at least one calibration oscillator and of at least one reference oscillator associated with the calibration oscillator is counted by means of at least one clock counter arranged downstream of the calibration oscillator and the reference oscillator, and a clock error resulting from the difference between these two numbers of clock cycles is integrated, and
- wherein the clock error is converted by means of at least one digital/analogue converter arranged downstream of the clock counter into analogue tuning signals, from which the calibrated activation signal is derived.

13. The method according to claim 12,
- wherein a first calibrated activation signal corresponds to a first of the tuning signals,
- wherein a second calibrated activation signal corresponds to a second of the tuning signals, and
- wherein a third calibrated activation signal corresponds to a third of the tuning signals.

14. Use of at least one circuit arrangement according to claim 1 for activating at least one voltage-controlled oscillator for at least one circuit for clock and data recovery with at least one binary phase detector.

15. A method for calibrating at least one activation signal provided for a voltage-controlled oscillator by means of a circuit arrangement according to claim 5,
- wherein the respective number of clock cycles of at least one calibration oscillator and of at least one reference oscillator associated with the calibration oscillator is counted by means of at least one clock counter arranged downstream of the calibration oscillator and the reference oscillator, and a clock error resulting from the difference between these two numbers of clock cycles is integrated, and
- wherein the clock error is converted by means of at least one digital/analogue converter arranged downstream of the clock counter into analogue tuning signals, from which the calibrated activation signal is derived.

16. The method according to claim 15,
- wherein a first calibrated activation signal corresponds to a first of the tuning signals,
- wherein a second calibrated activation signal corresponds to a second of the tuning signals, and
- wherein a third calibrated activation signal corresponds to a third of the tuning signals.

17. Use of at least one circuit arrangement according to claim 5 for activating at least one voltage-controlled oscillator for at least one circuit for clock and data recovery with at least one binary phase detector.

18. A method for calibrating at least one activation signal provided for a voltage-controlled oscillator by means of a circuit arrangement according to claim 8,
- wherein the respective number of clock cycles of at least one calibration oscillator and of at least one reference oscillator associated with the calibration oscillator is counted by means of at least one clock counter arranged downstream of the calibration oscillator and the reference oscillator, and a clock error resulting from the difference between these two numbers of clock cycles is integrated, and
- wherein the clock error is converted by means of at least one digital/analogue converter arranged downstream of the clock counter into analogue tuning signals, from which the calibrated activation signal is derived.

19. The method according to claim 18,
- wherein a first calibrated activation signal corresponds to a first of the tuning signals,
- wherein a second calibrated activation signal corresponds to a second of the tuning signals, and wherein a third calibrated activation signal corresponds to a third of the tuning signals.

20. Use of at least one circuit arrangement according to claim 8 for activating at least one voltage-controlled oscillator for at least one circuit for clock and data recovery with at least one binary phase detector.

* * * * *